United States Patent

[11] 3,576,499

[72] Inventors Walter Jack Axford
Chalfont Saint Peter;
Douglas Jacques Wootton, Harrow; Francis
Robert Trumble, Denham, England
[21] Appl. No. 790,389
[22] Filed Jan. 10, 1969
[45] Patented Apr. 27, 1971
[73] Assignee Electric & Musical Industries Limited
Middlesex, England
[32] Priority Jan. 10, 1968
[33] Great Britain
[31] 1401/68

[54] COAXIAL CAVITY TRANSISTOR OSCILLATOR WITH STEP RECOVERY DIODE FREQUENCY MULTIPLIER
10 Claims, 3 Drawing Figs.

[52] U.S. Cl. .......... 331/76, 307/319, 321/69, 328/16, 331/77, 331/101, 331/117
[51] Int. Cl. .......... H03b 5/18, H03b 19/00
[50] Field of Search .......... 331/75—77, 96, 101, 117 (D); 321/69, 69 (W), 69 (NL); 307/88.3, 319; 328/16—20

[56] References Cited

UNITED STATES PATENTS

| | | | |
|---|---|---|---|
| 3,246,266 | 4/1966 | Racy | 331/101X |
| 3,286,156 | 11/1966 | Barkes | 331/76X |
| 3,307,117 | 2/1967 | Williams | 331/76X |
| 3,353,087 | 11/1967 | Murphy et al. | 321/69 |
| 3,393,357 | 7/1968 | Adams et al. | 331/76X |

*Primary Examiner*—John Kominski
*Assistant Examiner*—Siegfried H. Grimm
*Attorney*—William W. Downing, Jr.

ABSTRACT: A microwave oscillator including a transistor connected as an oscillator and coupled to a resonator tuned to a first frequency, line means are coupled to the resonator, a step recovery diode is connected in shunt along the line means and a filter arrangement is provided which is tuned to a harmonic of the above-mentioned first frequency and is coupled to the line means to derive a signal of the harmonic from the step recovery diode.

Figures 1, 2, 3:
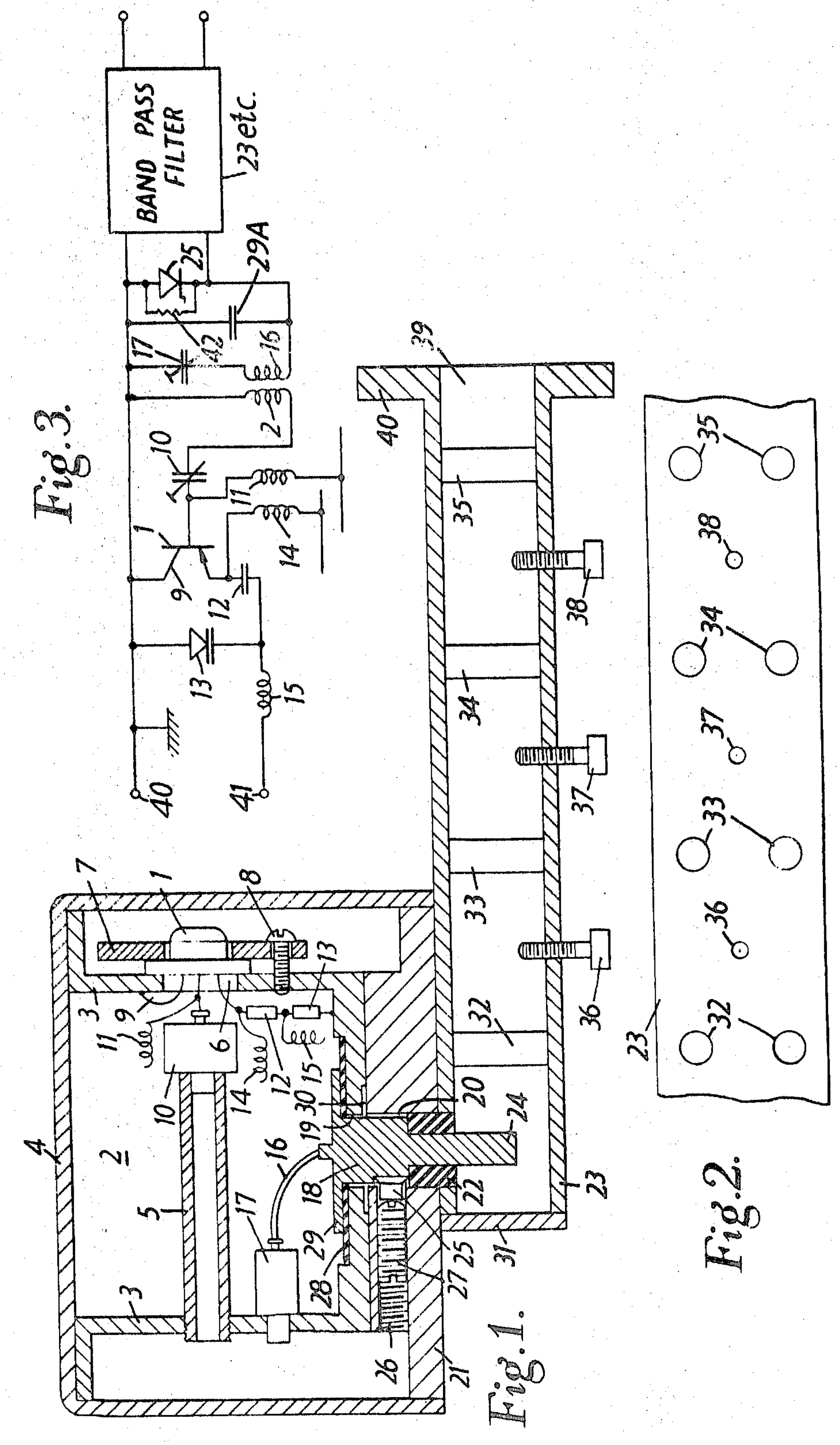

COAXIAL CAVITY TRANSISTOR OSCILLATOR WITH STEP RECOVERY DIODE FREQUENCY MULTIPLIER

The present invention relates to microwave oscillators and in particular to microwave oscillators using solid-state devices.

In microwave oscillators using solid-state devices as have hitherto been proposed there is provided a transistor oscillator coupled to a suitable resonator producing an oscillation of for example 100—300 MHz., which oscillation is passed through for example three or four frequency multipliers in cascade, the frequency multipliers comprising varactor diodes. With a frequency multiplier using a varactor diode as a harmonic generator the efficiency at a given harmonic of frequency NF of a driving oscillation of frequency F is proportional to $1/N^2$ and clearly it is not practicable to utilize high multiplying factors from such a multiplier, so that in practice factors of two, three or four are normally used. As each multiplier must be followed by a suitable filter for selecting the harmonic, and possibly idler circuits to enhance the efficiency of the conversion to the desired harmonic, and these circuits interact, it is exceedingly difficult to adjust the complete oscillator for maximum power output with adequate spectral purity.

It is an object of the present invention to provide a microwave oscillator which uses a simpler circuit arrangement and which is easier to adjust.

According to the present invention there is provided a microwave oscillator including a transistor connected as an oscillator and coupled to a resonator tuned to a first frequency, line means coupled to said resonator, a step recovery diode connected in shunt along said line means, and a filter arrangement tuned to a harmonic of said first frequency and coupled to said line means to derive a signal to said harmonic from said diode.

A step recovery diode is a semiconductor diode in which conduction in the forward direction takes place in the normal manner for a diode, but on the changeover to reverse conduction the diode continues to conduct with the same impedance as in the forward direction until the minority carriers in the body of the diode have migrated to the appropriate electrode, at which time the reverse current through the diode falls sharply to a few microamps corresponding to the normal reverse current of a semiconductor diode. It will be appreciated that this sudden change in the reverse current conduction characteristic of the diode introduces rapid steps into the output waveform of the diode and when driven by a sinusoidal waveform the output waveform is extremely rich in harmonic content. In fact frequency multipliers using step recovery diodes can be made with an efficiency of greater then 1/N for the Nth harmonic.

In order that the invention may be fully understood and readily carried into effect it will now be described with reference to the accompanying drawings in which:

FIG. 1 is a cross section of one example of an oscillator according to the invention, FIG. 2 is a plan view of part of the oscillator of FIG. 1, and FIG. 3 is an equivalent circuit diagram of the oscillator of FIG. 1.

In the drawings the same reference numerals are used for the same components in the different figures. In FIG. .1 there is shown a transistor 1 connected as an oscillator and coupled to a hollow resonator 2 which determines the frequency of oscillation of the transistor 1. The resonator 2 is formed by a metallic container 3 closed by a cover 4 and is provided with a central conductor 5 formed of a metal tube fixed into one wall of the container 3. In the opposite wall of the container 3 there is provided a hole 6 over which the transistor 1 is placed, it being retained there by the ring 7 which is attached to the wall of the container 3 by screws one of which is shown at 8. The collector electrode of the transistor 1 is connected directly to ground by means of the conductor 9. The base electrode of the transistor 1 is connected to one electrode of trimming capacitor 10 the other electrode of which is attached to the central conductor 5, the conductor conductor 5 forming the support for the condenser 10. The base electrode is also connected to a suitable voltage source via the radio frequency choke 11, the actual connection of the choke to the supply being omitted from FIG. 1 for reasons of clarity. The emitter electrode of the transistor 1 is connected to ground through the series connected combination of capacitor 12 and varactor diode 13. The power supply of the transistor 1 is connected to the emitter electrode via the radio frequency choke 14 and the polarizing supply for the varactor diode 13 is applied to it via the radio frequency choke 15, the actual connections of the chokes 14 and 15 to the voltage supplies are not shown in FIG. 1. As so far described the transistor 1 forms an oscillator running at a frequency determined partly by the dimensions of the resonator 2.

The oscillations set up in the resonator 2 are picked up by conductive loop 16 connected from one electrode of a trimming capacitor 17 to the central conductor 18 of a coaxial line. The trimmer capacitor 17 is mounted on the wall of the container 3 and provides an adjustable capacitive connection for one end of the loop 16 to the wall of the container 3. The conductor 18 passes through a hole 19 in the case of the container 3 and and into a hole 20 in a metal support member 21. The conductor 18 then passes through a dielectric plug 22 into the end of waveguide 23 to form a post 24 coupling with the waveguide 23. Part of the way along the conductor 18 there is provided a step recovery diode 25 projecting into a hole 26 in the support member 21 and retained therein by means of a screw plug 27. One electrode of the diode 25 is connected to the conductor 18 and the other electrode of the diode 25 is connected to the plug 27. The electrode 18 is supported by an insulating disc 28 placed between a flange 29 at the upper end of the conductor 18 and the base of the container 3, these components forming a capacitor 29A (shown in FIG. 3) which among other things serves to tune out the inductance introduced by the diode 25 at the frequency of the oscillation produced by the transistor 1. In addition the base of the container 3 is provided with an annular cutaway portion 30 which forms with the member 21 a radial transmission line having a susceptance tuning out the inductance introduced by the diode 25 at the output frequency. Alternatively the plug 27 can be shaped near the diode 25 to provide an equivalent susceptance.

A cavity filter is provided by a waveguide 23 having a short circuited end 31 and four pairs of posts 32, 33, 34 and 35 dividing the waveguide 23 into three separate filter sections individually tuned by screws 36, 37 and 38. The output end 39 of the waveguide 23 is provided with a flange 40 for attaching the guide to another guide portion or other devices for receiving the oscillation from the oscillator. It will be appreciated that screws or other arrangements may be used for joining the different parts of the assembly but these are not shown in FIG. 1.

As referred to above the transistor 1 is connected to cooperate with the resonator 2 to generate oscillations for example in the range of 700 to 900 MHz., and the precise frequency of this oscillation is dependent upon the capacities in the circuit and in particular the capacity presented by the varactor diode 13 which in turn is determined by the voltage applied across it via the choke 15. The oscillations produced by the transistor 1 are induced into the loop 16 and fed down the conductor 18. As described above the diode 15 modifies the waveform of the oscillation in the conductor 18 so that it includes sharp discontinuities and is therefore rich in harmonics, and this waveform appears at the coupling post 24 to be fed into the waveguide 23. The waveguide 23 is X-band waveguide and includes three filter sections defined by the posts 32, 33, 34 and 35 which are individually tuned to produce a suitable band pass filter for the range of frequencies desired from the oscillator. The waveform from the step recovery diode includes a voltage pulse for every cycle of input frequency, which pulse passes to the junction of the coaxial line and waveguide 23 where it sees a mismatch. Some of its energy is fed into the waveguide filter, the rest being reflected back to the diode 25. The distance from diode 25 to waveguide is made λ/4 at the harmonic frequency required so that when the pulse returns to the diode 25 the latter has just gone into forward conduction and therefore appears as a short circuit which reflects the pulse path to the waveguide. At the coaxial line waveguide junction more energy is given to the waveguide filter, the remainder being reflected. Thus the wave oscillates in the λ/4 line and the Q of this line is adjusted so that the energy in the pulse is dissipated into the filter in one input cycle. The adjustment of Q is achieved by altering the mismatch at the coaxial line waveguide junction and this is done by varying the position of the post 24 with respect to the waveguide filters to provide optimum conversion of the energy into the desired harmonic frequency. The frequency multiplication which can be obtained from the step recovery diode 25 in the embodiment shown lies in the range of nine to 20 times although lower or higher multiplication factors can be used.

FIG. 2 shows a plan view of the waveguide 23 showing the relative dispositions of the posts 32, 33, 34 and 35 together with the tuning screws 36, 37 and 38.

FIG. 3 shows the equivalent circuit of the oscillator shown in FIG. 1 and an examination of this circuit will render the operation of the oscillator clear. As referred to above, the components of FIG. 3 which correspond to the different parts of the oscillator shown in FIG. 1 have the same reference numerals, Terminals 40 and 41 are provided for the polarizing voltage for the varactor diode 13 to determine the frequency of oscillation of the transistor 1 and therefore the frequency of the final oscillation produced in the waveguide 23. The resistor 42 provides self-bias for the diode 25, its value being chosen for optimum performance; the resistor 42 is not shown in FIG. 1.

In FIG. 1 the capacitor 29A formed between the flange 29 of the conductor 18 and the base of the container 3, having as dielectric the insulating disc 28, also serves to prevent the return of any harmonic signals into the resonator 2 which might otherwise interfere with the stable operation of the oscillator. In addition as described above, in order to enhance the coupling of a desired harmonic included in the waveform produced by the step recovery diode 25 the effective distance of the diode 25 from the coupling post 24 is arranged to be one-quarter of a wave length of the desired harmonic; this distance is most conveniently adjusted experimentally. The coupling loop 16 in one example of the invention consists of a more or less straight strip of conductor joining the trimming capacitor 17 to the conductor 18 and the matching of the coupling loop to resonator 2 is effected by adjustment of the capacitor 17 so as to give the maximum power output from the waveguide 23.

The trimming capacitor 10 is adjusted to provide the desired range of frequencies from the waveguide 23, variation within the range being provided by the adjustment of the capacity of the varactor diode 13 under the control of the voltage applied to it via terminals 40 and 41. The diode 13 can be arranged to provide a frequency variation of, say, up to 600 MHz., at X-band frequencies. If desired however, the varactor 13 may be replaced by a fixed condenser or the value of the condenser 12 adjusted and the varactor 13 omitted altogether, and adjustment of the frequency of the oscillator effected by a mechanical coupling to adjust the capacity of the trimming capacitor 10.

In one embodiment of the invention the output frequency of the oscillator lies in the X-band that is to say in the range of 8.0 GHz. to 12 GHz., and in this embodiment the step recovery diode can be of the type HPA0320, the transistor 1 can be of the type 2N3866 and the varactor 13 can be of the type 1N5140, the actual internal dimensions of the resonator 2 being approximately 1½-inches × 1-inch × 1-inch. As stated above the varactor diode can produce a frequency variation of up to 600 MHz., and the position of this range of frequencies in the X-band is determined by adjustment of the trimming capacitor 10.

As the frequency stability of the oscillations produced by the oscillator including the transistor 1 will depend upon the mechanical rigidity of the leads, the interior of the resonator 2 may be filled with a foamed plastics material such as a suitable grade of polyurethane foam, especially for operation under conditions of high vibrations which contributes considerable mechanical support for the leads and any loose components within the resonator 2 without introducing a substantial increase in dielectric loss or in dielectric constant over that of air.

Although the invention has been described with reference to a specific embodiment it will be appreciated that it is not limited to this embodiment and many modifications may be made to the arrangement described to produce oscillations at any microwave frequency. For example, the design of the oscillator may be modified by the use of resonators other than that shown and it may include other circuit arrangements for the oscillator including one or more transistors or tuning varactors. Moreover, the cavity filter arrangement including the posts 32, 33, 34 and 35 and tuning screws 36, 37 and 38 may be replaced by any other suitable filter arrangement and may include any desired number of sections. Furthermore, an alternative embodiment of the invention may be made using strip line techniques.

We claim:

1. A microwave oscillator including a transistor connected as an oscillator and coupled to a resonator tuned to a first frequency, line means coupled to said resonator, a step recovery diode connected in shunt along said line means, and a filter arrangement tuned to a harmonic of said first frequency and coupled to said line means to derive a signal of said harmonic from said diode.

2. A microwave oscillator according to claim 1 in which said resonator is connected to the base of the transistor by a capacitor controlling the frequency of the resonator.

3. A microwave oscillator according to claim 1 in which said line means is a coaxial line, forming a capacitance with the wall of the resonator said capacitance being associated with said diode so as to reduce the inductance introduced by the diode at the frequency of the oscillations produced by said transistor oscillator.

4. A microwave oscillator according to claim 1 in which said line means is a coaxial line and includes a radial transmission line portion having a susceptance such as to reduce the inductance introduced by said diode at the output frequency.

5. A microwave oscillator according to claim 1 in which said line means is a coaxial line and the center conductor is connected via pickup means to a variable capacitor within the resonator and connected thereto so as to provide matching between said transistor oscillator and said diode.

6. A microwave oscillator according to claim 1 wherein a varactor diode is connected in the collector-emitter circuit of said transistor oscillator whereby the frequency of said transistor oscillator is made dependent on the voltage applied to said varactor.

7. A microwave oscillator comprising a transistor connected as an oscillator and disposed on the wall of a closed hollow resonator for said oscillator and tuned to a first frequency, a cavity filter tuned to a harmonic of said first frequency, coupling means coupling the resonator to said filter and a step recovery diode in shunt with said coupling means.

8. A microwave oscillator according to claim 7 in which a tubular metal member projects into the resonator from one wall thereof and carries at its free end a capacitor which is connected to the tubular member and to the base of the transistor.

9. A microwave oscillator according to claim 7 in which said coupling means is a coaxial line from within said hollow resonator to within said cavity filter, the end of the inner conductor within said resonator having a flange which overlies dielectric material provided on an inner wall surface of said resonator.

10. A microwave oscillator according to claim 7, said hollow resonator being filled with foamed plastics material.